US012234343B2

(12) United States Patent
Yang et al.

(10) Patent No.: US 12,234,343 B2
(45) Date of Patent: Feb. 25, 2025

(54) PHOTOVOLTAIC ENCAPSULANT FILMS COMPRISING FUMED ALUMINA

(71) Applicant: Dow Global Technologies LLC, Midland, MI (US)

(72) Inventors: Yunfeng Yang, Shanghai (CN); Brian M. Habersberger, Houston, TX (US); Weiming Ma, Shanghai (CN); Yuyan Li, Shanghai (CN); Hong Yang, Shanghai (CN); Chao He, Shanghai (CN)

(73) Assignee: Dow Global Technologies LLC, Midland, MI (US)

( * ) Notice: Subject to any disclaimer, the term of this patent is extended or adjusted under 35 U.S.C. 154(b) by 0 days.

(21) Appl. No.: 17/638,399

(22) PCT Filed: Aug. 30, 2019

(86) PCT No.: PCT/CN2019/103788
§ 371 (c)(1),
(2) Date: Feb. 25, 2022

(87) PCT Pub. No.: WO2021/035713
PCT Pub. Date: Mar. 4, 2021

(65) Prior Publication Data
US 2022/0306831 A1    Sep. 29, 2022

(51) Int. Cl.
| C08K 3/22 | (2006.01) |
| C08K 5/00 | (2006.01) |
| C08K 5/14 | (2006.01) |
| C08K 5/54 | (2006.01) |
| C08K 5/5425 | (2006.01) |
| H01L 31/048 | (2014.01) |

(52) U.S. Cl.
CPC ............. *C08K 3/22* (2013.01); *C08K 5/0025* (2013.01); *C08K 5/14* (2013.01); *C08K 5/5425* (2013.01); *H01L 31/0481* (2013.01); *C08K 2003/2227* (2013.01)

(58) Field of Classification Search
CPC ...................................................... C08K 3/22
See application file for complete search history.

(56) References Cited

U.S. PATENT DOCUMENTS

| 4,623,755 | A | 11/1986 | Henkel et al. | |
| 5,851,968 | A | 12/1998 | Schnur | |
| 6,147,180 | A * | 11/2000 | Markel | C08L 23/0815 526/348 |
| 10,597,521 | B2 * | 3/2020 | Lu | C08L 23/06 |
| 11,578,196 | B2 | 2/2023 | Wang et al. | |
| 2010/0069538 | A1 * | 3/2010 | Kempe | C08K 5/22 524/502 |
| 2012/0009382 | A1 | 1/2012 | Kishimoto et al. | |
| 2012/0293909 | A1 | 11/2012 | Tatemichi et al. | |
| 2013/0102734 | A1 * | 4/2013 | Takaragi | H01L 31/0203 526/282 |
| 2013/0167926 | A1 | 7/2013 | Niemann et al. | |
| 2014/0026960 | A1 * | 1/2014 | Bizet | H01L 31/0481 136/259 |
| 2017/0183431 | A1 * | 6/2017 | Yoda | C08K 5/14 |
| 2017/0233564 | A1 * | 8/2017 | Li | C08L 31/04 524/94 |
| 2020/0347211 | A1 | 11/2020 | Wang et al. | |
| 2022/0041161 | A1 | 12/2022 | Yang et al. | |

FOREIGN PATENT DOCUMENTS

| CN | 104263285 | | 1/2015 |
| CN | 104327456 | A | 2/2015 |
| CN | 106750853 | A | 5/2017 |
| CN | 107383538 | A | 11/2017 |
| CN | 110105651 | | 7/2021 |
| JP | 2015126170 | A | 7/2015 |
| WO | 200914541 | A1 | 1/2009 |
| WO | WO2016101988 | * | 6/2016 |
| WO | 2019000744 | | 1/2019 |
| WO | 2019019988 | | 1/2019 |
| WO | 2021041562 | | 3/2021 |

OTHER PUBLICATIONS

Qenos, Thermal and Electrical properties of Polyethylene, https://www.qenos.com/internet/home.nsf/(LUImages)/Tech%20Guide:%20Thermal%20and%20electrical%20properties%20of%20PE/$File/144%20QEN%20eX%20TN%20Thermal%20&%20Electrical%20properties%20of%20PE.pdf, downloaded Sep. 29, 2023 (Year: 2023).*
Ineos, Typical Engineering Properties of Polypropylene, (https://www.ineos.com/globalassets/ineos-group/businesses/ineos-olefins-and-polymers-usa/products/technical-information--patents/ineos-engineering-properties-of-pp.pdf), downloaded Sep. 29, 2023 (Year: 2023).*
Omnexus, Plastics and Elastomers, Volume Resistivity, pp. 1-12, ( https://omnexus.specialchem.com/polymer-properties/properties/volume-resistivity) downloaded Sep. 29, 2023 (Year: 2023).*
Professional Plastics, Electrical Properties of Plastic Materials (https://www.professionalplastics.com/professionalplastics/ElectricalPropertiesofPlastics.pdf) (downloaded Sep. 29, 2023) (Year: 2023).*
DOW data sheet, Engage TM 8411, downloaded Sep. 29, 2023 (Year: 2023).*
DOW Engage 8100, Specification Sheet, pp. 1-2 (Year: 2011).*
Li, "The electrical properties and processing characteristic of the cross-linked polyethylene based insulation for high-voltage direct current cables" 2019, p. 341-344.

(Continued)

*Primary Examiner* — Jayne L Mershon
(74) *Attorney, Agent, or Firm* — Karen L. Beckman

(57) ABSTRACT

The present disclosure relates to a curable composition for an encapsulant film, the curable composition comprising: (A) a polyolefin; (B) a fumed alumina; (C) an organic peroxide; (D) a silane coupling agent; (E) a crosslinking co-agent; and, optionally, (F) an additive component comprising a UV stabilizer, wherein the polyolefin has a volume resistivity of less than 4.0E+15 ohm·cm. The present disclosure further relates to an encapsulant film made from such a curable composition and a PV module containing such an encapsulant film.

9 Claims, No Drawings

(56) References Cited

OTHER PUBLICATIONS

Patel, "Volume Resistivity of Epoxy containing Nano-sized Al2O3 fillers" 2008, p. 361-365.
PCT/CN2019/103788, International Search Report and Written Opinion with a mailing date of Jun. 5, 2020.
Wang, "Preparation, Microstructure and Properties of Polyethylene/Alumina nanocomposites for HVDC insulation" 2015, vol. 22, No. 6, p. 3350-3356.
Office action from corresponding Chinese application: 201980100642X dated Feb. 2, 2024.

* cited by examiner

PHOTOVOLTAIC ENCAPSULANT FILMS COMPRISING FUMED ALUMINA

FIELD

This disclosure relates to polyolefin-based photovoltaic (PV) encapsulant films having improved volume resistivity, as well as PV modules containing such encapsulant films.

BACKGROUND

Ethylene vinyl acetate (EVA) is currently widely used as an encapsulating material for PV cells due to its transparency, flexibility and ease of conversion into a crosslinkable sheet. However, EVA has poor weather resistant properties and is highly polar, resulting in low volume resistivity (VR). VR is important because it affects the potential induced degradation (PID) resistance performance Encapsulating solar cells with low-VR encapsulant materials may result in significant module power loss due to PID.

Polyolefin-based encapsulating materials, such as ethylene/alpha-olefin copolymers, have excellent transparency, adhesion, heat resistance, and can easily be converted into crosslinkable film. While polyolefin-based encapsulating materials generally have improved VR in comparison to EVA, such materials have a wide range of VR, with the best PID-preventing performance achieved with polyolefins having a VR greater than $10^{17}$ ohm·cm. Polyolefins with lower VR would benefit from an improvement in VR. Accordingly, a need exists for improving the VR of PV encapsulant films containing low-VR polyolefins.

SUMMARY

The present disclosure relates to a curable composition for an encapsulant film, the curable composition comprising: (A) a polyolefin; (B) a fumed alumina; (C) an organic peroxide; (D) a silane coupling agent; (E) a crosslinking co-agent; and, optionally, (F) an additive component comprising an antioxidant and/or a UV stabilizer, wherein the polyolefin has a volume resistivity of less than 4.0E+15 ohm·cm.

The present disclosure further relates to an encapsulant film comprising a crosslinked polymeric composition that is the reaction product of a curable composition comprising: (A) a polyolefin; (B) a fumed alumina; (C) an organic peroxide; (D) a silane coupling agent; (E) a crosslinking co-agent; and, optionally, (F) an additive component comprising an antioxidant and/or a UV stabilizer, wherein the polyolefin has a volume resistivity of less than 4.0E+15 ohm·cm.

The present disclosure further relates to a PV module comprising a solar cell and at least one encapsulant film layer comprising a crosslinked polymeric composition that is the reaction product of a curable composition comprising: (A) a polyolefin; (B) a fumed alumina; (C) an organic peroxide; (D) a silane coupling agent; (E) a crosslinking co-agent; and, optionally, (F) an additive component comprising an antioxidant and/or a UV stabilizer, wherein the polyolefin has a volume resistivity of less than 4.0E+15 ohm·cm.

Definitions

All references to the Periodic Table of the Elements herein shall refer to the Periodic Table of the Elements, published and copyrighted by CRC Press, Inc., 2003. Also, any references to a Group or Groups shall be to the Group or Groups reflected in this Periodic Table of the Elements using the IUPAC system for numbering groups.

For purposes of United States patent practice, the contents of any referenced patent, patent application or publication are incorporated by reference in their entirety (or its equivalent U.S. version is so incorporated by reference), especially with respect to the disclosure of definitions (to the extent not inconsistent with any definitions specifically provided in this disclosure) and general knowledge in the art.

The numerical ranges disclosed herein include all values from, and including, the lower value and the upper value. For ranges containing explicit values (e.g., a range from 1 or 2, or 3 to 5, or 6, or 7) any subrange between any two explicit values is included (e.g., the range 1-7 above includes all subranges 1 to 2; 2 to 6; 5 to 7; 3 to 7; 5 to 6; etc.).

"Polymer" refers to a compound prepared by polymerizing monomers, whether of the same or a different type. The generic term "polymer" thus embraces the term "homopolymer" that refers to polymers prepared from only one type of monomer and the terms "interpolymer" or "copolymer" as defined herein. Trace amounts of impurities, for example, catalyst residues, may be incorporated into and/or within the polymer.

A "polyolefin" is a polymer produced from the polymerization of an olefin as a monomer, where an olefin monomer is a linear, branched, or cyclic compound of carbon and hydrogen having at least one double bond. A polyolefin, used interchangeably with an "olefin-based polymer," contains more than 50 percent polymerized olefin monomer (based on total weight of the polyolefin), and, optionally, may contain one or more comonomer(s). Non-limiting examples of polyolefins include ethylene-based polymers and propylene-based polymers.

The term "interpolymer" refers to a polymer prepared by the polymerization of at least two different types of monomers. This term include both "copolymers," i.e., polymers prepared from two different types of monomers, and polymers prepared from more than two different types of monomers, e.g., terpolymers, tetrapolymers, etc. This term also embraces all forms of interpolymers, such as random, block, homogeneous, heterogeneous, etc.

An "alpha-olefin" or "α-olefin" is a hydrocarbon molecule, the hydrocarbon molecule comprising an ethylenic unsaturation, this unsaturation located between the first and second carbon atoms. For the purposes of this disclosure, non-limiting examples of alpha-olefins include ethylene, propylene, 1-butene, 1-pentene, 1-hexene, 1-octene, 1-dodecene, and mixtures of two or more of these monomers.

An "ethylene-based polymer" or "ethylene polymer" is a polymer that contains a majority amount (greater than 50 wt %) of polymerized ethylene, based on the weight of the polymer, and, optionally, may further contain polymerized units of at least one comonomer.

An "ethylene-based interpolymer" is an interpolymer that contains, in polymerized form, a majority amount (greater than 50 wt %) of ethylene, based on the weight of the interpolymer, and further contains polymerized units of at least one comonomer. The ethylene-based interpolymer may be a random interpolymer (i.e., comprises a random distribution of its monomeric constituents) or a block interpolymer.

An "ethylene/alpha-olefin interpolymer" is an interpolymer that contains a majority amount (greater than 50 wt %) of polymerized ethylene, based on the weight of the interpolymer, and further contains polymerized units of at least one alpha-olefin. The ethylene/alpha-olefin interpolymer may be a random interpolymer or a block interpolymer.

An "ethylene/alpha-olefin copolymer" is a copolymer that contains a majority amount (greater than 50 wt %) of polymerized ethylene, based on the weight of the copolymer, and further contains polymerized units of an alpha-olefin. The ethylene/alpha-olefin copolymer may be a random copolymer or a block copolymer.

The term "olefin block copolymer" or "OBC" refers to an ethylene/alpha-olefin multi-block interpolymer and includes ethylene and one or more copolymerizable alpha-olefin comonomers in polymerized form, characterized by multiple blocks or segments of two or more (preferably three or more) polymerized monomer units, the blocks or segments differing in chemical or physical properties. Specifically, the term "olefin block copolymer" refers to a polymer comprising two or more (preferably three or more) chemically distinct regions or segments (referred to as "blocks") joined in a linear manner, that is, a polymer comprising chemically differentiated units which are joined (covalently bonded) end-to-end with respect to polymerized functionality, rather than in pendent or grafted fashion. The blocks differ in the amount or type of comonomer incorporated therein, the density, the amount of crystallinity, the type of crystallinity (e.g., polyethylene versus polypropylene), the crystallite size attributable to a polymer of such composition, the type or degree of tacticity (isotactic or syndiotactic), region-regularity or region-irregularity, the amount of branching, including long chain branching or hyper-branching, the homogeneity, and/or any other chemical or physical property. The block copolymers are characterized by unique distributions of both polymer polydispersity (PDI or Mw/Mn) and block length distribution, e.g., based on the effect of the use of a shuttling agent(s) in combination with catalyst systems. Non-limiting examples of the olefin block copolymers of the present disclosure, as well as the processes for preparing the same, are disclosed in U.S. Pat. Nos. 7,858,706 B2, 8,198,374 B2, 8,318,864 B2, 8,609,779 B2, 8,710,143 B2, 8,785,551 B2, and 9,243,090 B2, which are all incorporated herein by reference in their entirety.

A "blend" or "polymer blend" is a composition of two or more polymers. Such a blend may or may not be miscible. Such a blend may or may not be phase separated. Such a blend may or may not contain one or more domain configurations, as determined from transmission electron spectroscopy, light scattering, x-ray scattering, and any other method known in the art.

A "composition" or "formulation" is a mixture or blend of two or more components. In the context of a mix or blend of materials from which an article of manufacture is fabricated, the composition includes all the components of the mix, e.g., polymers, catalysts, and any other additives or agents such as cure catalysts, antioxidants, flame retardants, etc.

The terms "comprising," "including," "having" and like terms are not intended to exclude the presence of any additional component, step or procedure, whether or not the same is specifically disclosed. All processes claimed through use of "comprising" may include one or more additional steps, pieces of equipment or component parts, and/or materials unless stated to the contrary. In contrast, the term, "consisting essentially of" excludes from the scope of any succeeding recitation any other component, step or procedure, excepting those that are not essential to operability. The term "consisting of" excludes any component, step or procedure not specifically delineated or listed. The term "or," unless stated otherwise, refers to the listed members individually as well as in any combination.

"Direct contact" is a configuration whereby two components are in physical contact with each other with no intervening layer(s) and/or no intervening material(s) located between a portion of the two contacting components.

The term "film," including when referring to a "film layer" in a thicker article, unless expressly having the thickness specified, includes any thin, flat extruded or cast article having a generally consistent and uniform thickness typically from 25 micrometers to 1.25 millimeters (mm) or more. "Layers" in films can be very thin, as in the cases of nanolayers, or microlayers. As used herein, the term "sheet," unless expressly having the thickness specified, includes any thin, flat extruded or cast article having a generally consistent and uniform thickness greater than a "film."

"Glass" is a hard, brittle, transparent solid, such as that used for windows, bottles, or eyewear, including, but not limited to, pure silicon dioxide ($SiO_2$), soda-lime glass, borosilicate glass, sugar glass, isinglass (Muscovy-glass), photovoltaic glass or aluminum oxynitride.

"Photovoltaic cell", "PV cell" and like terms mean a structure that contains one or more photovoltaic effect materials of any of several inorganic or organic types. For example, commonly used photovoltaic effect materials include one or more of the known photovoltaic effect materials including but not limited to crystalline silicon, polycrystalline silicon, amorphous silicon, copper indium gallium (di)selenide (CIGS), copper indium selenide (CIS), cadmium telluride, gallium arsenide, dye-sensitized materials, and organic solar cell materials. PV cells are typically employed in a laminate structure and have at least one light-reactive surface that converts the incident light into electric current. Photovoltaic cells are well known to practitioners in this field and are generally packaged into photovoltaic modules that protect the cell(s) and permit their usage in their various application environments, typically in outdoor applications. PV cells may be flexible or rigid in nature and include the photovoltaic effect materials and any protective coating surface materials that are applied in their production as well as appropriate wiring and electronic driving circuitry.

"Photovoltaic module", "PV module" and like terms refer to a structure including a PV cell. A PV module may also include a cover sheet, front encapsulant film, rear encapsulant film and backsheet, with the PV cell sandwiched between the front encapsulant film and rear encapsulant film. An exemplary, non-limiting PV module may include a top layer, a front encapsulant layer, at least one photovoltaic cell, typically a plurality of such cells arrayed in a linear or planar pattern, a rear encapsulant layer, and a backsheet. The front encapsulant layer is in direct contact with both the photovoltaic cell and also partially with the rear encapsulant layer. The front encapsulant layer and the rear encapsulant layer wholly surround, or encapsulate, the photovoltaic cell. The backsheet can be a monolayer structure or a multilayer structure or glass (making glass/glass PV modules) which protects the back surface of a PV module.

Test Methods

Each measurable property disclosed herein is measured in accordance with the methodologies discussed below.

Density is measured in accordance with ASTM D792, Method B. The result is recorded in grams (g) per cubic centimeter (g/cc or $g/cm^3$).

Flexural modulus (2% secant) is measured in accordance with ASTM D790 and reported in psi.

Initial glass adhesion: Laminated samples are cut into three specimens of 1 inch in width (cut backsheet and film layers). A 180° peel test is used to measure the glass adhesion strength (maximum glass adhesion strength and average glass adhesion strength from 1 inch to 2 inches of delamination). The test is conducted on an Instron™ 5565 under controlled ambient conditions. At least three specimens are tested to get the average. Results are reported in Newtons per centimeter (N/cm).

Mean Transmittance: The transmittance of compression molded films is determined using a LAMBDA 950 UV/Vis Spectrophotometer (PerkinElmer) equipped with a 150 mm integrating sphere. At least three samples are tested and the average transmittance from 380 nm to 1100 nm is collected. Results are reported in percent.

Melt index (MI) is performed according to ASTM D1238, Condition 190° C./2.16 kilogram (kg) weight, and is reported in grams eluted per 10 minutes (g/10 min).

Melting Crystallization and Glass Transition: Differential Scanning calorimetry (DSC) can be used to measure the melting, crystallization, and glass transition behavior of a polymer over a wide range of temperature. For example, the TA Instruments Q1000 DSC, equipped with an RCS (refrigerated cooling system) and an autosampler is used to perform this analysis. During testing, a nitrogen purge gas flow of 50 ml/min is used. Each sample is melt pressed into a thin film at about 175° C.; the melted sample is then air-cooled to room temperature (about 25° C.). A 3-10 mg, 6 mm diameter specimen is extracted from the cooled polymer, weighed, placed in a light aluminum pan (ca 50 mg), and crimped shut. Analysis is then performed to determine its thermal properties.

The thermal behavior of the sample is determined by ramping the sample temperature up and down to create a heat flow versus temperature profile. First, the sample is rapidly heated to 180° C. and held isothermal for 3 minutes in order to remove its thermal history. Next, the sample is cooled to −40° C. at a 10° C./minute cooling rate and held isothermal at −40° C. for 3 minutes. The sample is then heated to 180° C. (this is the "second heat" ramp) at a 10° C./minute heating rate. The cooling and second heating curves are recorded. The cool curve is analyzed by setting baseline endpoints from the beginning of crystallization to −20° C. The heat curve is analyzed by setting baseline endpoints from −20° C. to the end of melt. The values determined are extrapolated onset of melting, Tm, and extrapolated onset of crystallization, Tc. Heat of fusion (H$_f$) (in Joules per gram), and the calculated % crystallinity for polyethylene samples using the Equation below:

% Crystallinity=((H$_f$)/292 J/g)×100

The heat of fusion (H$_f$) and the peak melting temperature are reported from the second heat curve. Peak crystallization temperature is determined from the cooling curve.

Melting point, Tm, is determined from the DSC heating curve by first drawing the baseline between the start and end of the melting transition. A tangent line is then drawn to the data on the low temperature side of the melting peak. Where this line intersects the baseline is the extrapolated onset of melting (Tm). This is as described in Bernhard Wunderlich, *The Basis of Thermal Analysis, in Thermal Characterization of Polymeric Materials* 92, 277-278 (Edith A. Turi ed., 2d ed. 1997).

Crystallization temperature, Tc, is determined from a DSC cooling curve as above except the tangent line is drawn on the high temperature side of the crystallization peak. Where this tangent intersects the baseline is the extrapolated onset of crystallization (Tc).

Glass transition temperature, Tg, is determined from the DSC heating curve where half the sample has gained the liquid heat capacity as described in Bernhard Wunderlich, *The Basis of Thermal Analysis, in Thermal Characterization of Polymeric Materials* 92, 278-279 (Edith A. Turi ed., 2d ed. 1997). Baselines are drawn from below and above the glass transition region and extrapolated through the Tg region. The temperature at which the sample heat capacity is half-way between these baselines is the Tg.

Moving Die Rheometer (MDR): The MDR is loaded with approximately 4 grams of each casted film. The MDR is run for 25 minutes at 150° C. The time versus torque curve for each sample is recorded over the given interval. The maximum torque exerted by the MDR during a 25 minute testing interval (MH) is recorded in deci-Newton meters (dNm). The MH typically corresponds to the maximum torque exerted at 25 minutes. The time it takes for the torque to reach x % of MH (t$_x$) is recorded in minutes. t$_x$ is a standardized measurement to understand the curing kinetics of each resin. The time to reach 90% of MH (t$_{90}$) is recorded in minutes.

Volume Resistivity: The volume resistivity is determined by the following method which is based on ASTM D257. The volume resistivity is determined using a Keithley 6517 B electrometer, combined with the Keithley 8009 test fixture. The Keithley model 8009 test chamber is located inside the forced air oven which is capable of operating at elevated temperatures (maximum temperature 80° C.). The leakage current is recorded from the instrument via software and the following equation is used to calculate the volume resistivity (VR):

$$\rho = \frac{V \times A}{I \times t}$$

wherein $\rho$ is the volume resistivity in ohm·cm, V is the applied voltage in volts, A is the electrode contact area in cm$^2$, I is the leakage current in amps recorded after 10 minutes of applied voltage, and t is the thickness of the sample. The thickness of the compression molded film is measured before the test. Five points of the film are measured to get the average thickness, which is used in the calculation. The test is conducted at 1000 volts at room temperature. Two compression molded films are tested and the recorded VR is the average of the two tests. Results are reported in ohm-centimeters (ohm·cm).

DETAILED DESCRIPTION

Polyolefin

The (A) polyolefin of the present disclosure is any olefin-based homopolymer (in which an olefin is the sole monomer) or olefin-based interpolymer, in which an olefin is the primary monomer (that is, the olefin-based interpolymer comprises greater than 50 wt % units derived from an olefin). In these embodiments in which the polyolefin is an interpolymer, the comonomer is a different C$_{2-20}$ linear, branched or cyclic alpha-olefin. For purposes of this disclosure, ethylene is an alpha-olefin. Non-limiting examples of C$_{2-20}$ alpha-olefins for use as comonomers include ethylene, propylene, 1-butene, 4-methyl-1-pentene, 1-hexene, 1-octene, 1-decene, 1-dodecene, 1-tetradecene, 1-hexadecene, and 1-octadecene.

In certain embodiments, the polyolefin is an ethylene-based polymer that is an ethylene/alpha-olefin interpolymer that may be a random or block interpolymer. In further embodiments, the polyolefin is an ethylene-based polymer that is an ethylene/alpha-olefin copolymer that may be a random or block copolymer. Non-limiting examples of ethylene/alpha-olefin copolymers include copolymers of ethylene and $C_3$-$C_8$ alpha-olefins, or $C_4$-$C_8$ alpha-olefins, such as ethylene/propylene copolymers, ethylene/1-butene copolymers, ethylene/1-hexene copolymers, ethylene/1-octene copolymers, and combinations thereof.

In certain embodiments, the polyolefin is an ethylene/alpha-olefin random copolymer. Examples of ethylene/alpha-olefin random copolymers include but are not limited to ethylene/propylene random copolymers, ethylene/1-butene random copolymers, ethylene/1-hexene random copolymers, ethylene/1-octene random copolymers, and combinations thereof. In certain embodiments, the polyolefin is an ethylene/alpha-olefin random copolymer, wherein the alpha-olefin is selected from 1-octene, 1-hexene, 1-butene, and propylene. In further embodiments, the polyolefin is an ethylene/1-octene random copolymer.

In further embodiments, the polyolefin is an olefin block copolymer and, further, an ethylene/alpha-olefin multiblock interpolymer as defined herein.

In certain embodiments, the polyolefin is absent a heteroatom. The term "heteroatom," as used herein, is an atom other than carbon or hydrogen. The heteroatom can be a non-carbon atom from Groups IV, V, VI and VII of the Periodic Table. Non-limiting examples of heteroatoms include: F, N, O, P, B, S, and Si.

In some embodiments, the polyolefin has a volume resistivity from greater than 1.0E+12 ohm·cm to less than 4.0E+15 ohm·cm, or from greater than 5.0E+12 ohm·cm to less than 4.0E+15 ohm·cm, or from greater than 1.0E+13 ohm·cm to less than 4.0E+15 ohm·cm, or from greater than 5.0E+13 ohm·cm to less than 4.0E+15 ohm·cm, or from greater than or equal to 1.0E+14 ohm·cm to less than 4.0E+15 ohm·cm, or from greater than or equal to 5.0E+14 ohm·cm to less than 4.0E+15 ohm·cm, or from greater than or equal to 5.0E+14 ohm·cm to less than or equal to 3.5E+15 ohm·cm, or from greater than or equal to 7.0E+14 ohm·cm to less than or equal to 3.0E+15 ohm·cm.

In further embodiments, the polyolefin has, in accordance with the methods disclosed herein or similar methods, a volume resistivity from 1.0E+12 ohm·cm, or 5.0E+12 ohm·cm, or 1.0E+13 ohm·cm, or 5.0E+13 ohm·cm, or 1.0E+14 ohm·cm, or 5.0E+14 ohm·cm, or 7.0E+14 ohm·cm, or 9.0E+14 ohm·cm, or 1.0E+15 ohm·cm to 1.5E+15 ohm·cm, or 2.0E+15 ohm·cm, or 2.5E+15 ohm·cm, or 3.0E+15 ohm·cm, or 3.5E+15 ohm·cm, or less than 4.0E+15 ohm·cm.

In certain embodiments, the polyolefin has a density from 0.850 g/cc, or 0.855 g/cc, or 0.860 g/cc, or 0.865 g/cc, or 0.870 g/cc, or 0.875 g/cc to 0.880 g/cc, or 0.885 g/cc, or 0.890 g/cc, or 0.895 g/cc, or 0.900 g/cc, or 0.905 g/cc, or 0.910 g/cc, or 0.915 g/cc, or 0.920 g/cc, as measured in accordance with ASTM D792, Method B. For example, in certain embodiments, the polyolefin has a density from 0.850 g/cc to 0.920 g/cc, or from 0.855 g/cc to 0.910 g/cc, or from 0.860 g/cc to 0.900 g/cc, or from 0.860 g/cc to 0.895 g/cc, or from 0.860 g/cc to 0.890 g/cc, or from 0.865 g/cc to 0.885 g/cc, or from 0.865 g/cc to 0.880 g/cc, as measured in accordance with ASTM D792, Method B.

In certain embodiments, the polyolefin has a melt index (MI) from 0.1 g/10 min, or 0.5 g/10 min, or 1 g/10 min, or 5 g/10 min, or 10 g/10 min, or 12 g/10 min to 18 g/10 min, or 20 g/10 min, or 25 g/10 min, or 30 g/10 min, or 50 g/10 min, or 75 g/10 min, or 100 g/10 min, as measured in accordance with ASTM D1238, at 190° C./2.16 kg. For example, in certain embodiments, the polyolefin has a melt index (MI) from 0.1 g/10 min to 100 g/10 min, or from 0.5 g/10 min to 100 g/10 min, or from 1 g/10 min to 100 g/10 min, or from 1 g/10 min to 75 g/10 min, or from 1 g/10 min to 50 g/10 min, or from 1 g/10 min to 30 g/10 min, or from 5 g/10 min to 30 g/10 min, or from 5 g/10 min to 20 g/10 min, as measured in accordance with ASTM D1238, at 190° C./2.16 kg.

In certain embodiments, the polyolefin has a melting point (Tm) from 55° C., or 60° C., or 75° C., or 90° C., or 95° C., or 100° C. to 105° C., or 110° C., as measured using DSC.

In certain embodiment, the olefin-based polymer has a glass transition temperature, Tg, from −30° C., or −35° C. to −40° C., or −45° C., or −50° C., or −60° C., as measured using DSC.

In an embodiment, the olefin-based polymer has a flexural modulus (2% secant) from greater than or equal to 500 psi, or greater than or equal to 750 psi, or greater than or equal to 1000 psi to 2000 psi, or 3000 psi, or 3500 psi, or 4000 psi, or less than 6000 psi, as measured in accordance with ASTM D790.

Suitable polyolefins in accordance with the present disclosure include but are not limited to those available as ENGAGE™ polyolefin elastomers and INFUSE™ olefin block copolymers from The Dow Chemical Company, those available as Exact™ plastomers from ExxonMobil Chemical Company, and those available as LUCENE™ polyolefins from LG Chemical.

Blends of any of the polyolefins described above may also be used, so long as the volume resistivity of the blend is less than 4.0E+15 ohm·cm. The polyolefin or blends thereof may be blended or diluted with one or more other polymers to the extent that the polyolefin(s) and other polymer(s) are (i) miscible with one another, (ii) the other polymer(s) have little, if any, impact on the desirable properties of the polyolefin (i.e., optics and low modulus), and (iii) the content of polyolefin(s) constitute greater than 50 wt %, or 60 wt %, or 70 wt %, or 75 wt %, or 80 wt % to 90 wt %, or 95 wt %, or 98 wt %, or 99 wt %, or less than 100 wt % of the blend based on the total weight of the blend.

The polyolefin of the present disclosure may be any combination of embodiments disclosed herein.

Fumed Alumina

The fumed alumina (aluminum oxide) is a type of synthetic alumina. As a synthetic alumina, the fumed alumina of the present disclosure has a high degree of chemical purity and a high specific surface area. In further embodiments, the fumed alumina may be prepared by flame hydrolysis processes known in the art, such as processes similar to the AEROSIL® process. The flame hydrolysis processes for preparing the fumed alumina can be controlled by varying the concentration of the reactants, the flame temperature, and certain dwell times. This will affect the particle size, particle size distribution, specific surface area, and the surface properties of the fumed alumina products. In other words, different fumed alumina products can be made depending on how the process is controlled.

The fumed alumina particles prepared by flame hydrolysis processes are by nature hydrophilic unless specifically treated. To form hydrophobic fumed alumina particles, the hydrophilic fumed alumina particles are subjected to chemical post-treatment with a hydrophobic agent. Suitable hydrophobic agents include but are not limited to organosilane compounds, such as alkoxysilanes, silazanes, and siloxanes.

The term "hydrophobic-treated fumed alumina," as used herein, is fumed alumina in particle form, with a hydrophobic agent bonded to the particle surface by way of one or more oxygen covalent bonds.

In certain embodiments, the fumed alumina of the present disclosure is hydrophilic fumed alumina. In further embodiments, the fumed alumina of the present disclosure is hydrophobic-treated fumed alumina. The fumed alumina of the present disclosure may be in the thermodynamically stable alpha form or the metastable gamma form, including the gamma, delta, and theta forms.

In certain embodiments, the fumed alumina has a specific surface area (BET) from greater than 50 $m^2/g$ to less than 200 $m^2/g$. In certain embodiments, the fumed alumina has a specific surface area (BET) from 55 $m^2/g$ to 150 $m^2/g$, or from 60 $m^2/g$ to 140 $m^2/g$, or from 65 $m^2/g$ to 130 $m^2/g$. in further embodiments, the fumed alumina has a specific surface area (BET) of 55 $m^2/g$, or 60 $m^2/g$, or 65 $m^2/g$, or 70 $m^2/g$, or 75 $m^2/g$, or 80 $m^2/g$, or 85 $m^2/g$ to 95 $m^2/g$, or 100 $m^2/g$, or 105 $m^2/g$, or 110 $m^2/g$, or 115 $m^2/g$, or 120 $m^2/g$, or 130 $m^2/g$, or 140 $m^2/g$, or 150 $m^2/g$, or less than 200 $m^2/g$.

Non-limiting examples of hydrophilic fumed alumina are those available as AEROXIDE® Alu 65 and Alu 130 from Evonik Industries. Non-limiting examples of hydrophobic-treated fumed alumina are those available as AEROXIDE® Alu C from Evonik Industries.

The fumed alumina of the present disclosure may be a blend of a hydrophilic fumed alumina and a hydrophobic-treated fumed alumina or may be blend of more than hydrophilic fumed alumina.

The fumed alumina of the present disclosure may be any combination of embodiments disclosed herein.

Organic Peroxide

The organic peroxide is a molecule containing carbon atoms, hydrogen atoms, and two or more oxygen atoms, and having at least one —O—O— group, such that when there are more than one —O—O— group, each —O—O— group is bonded indirectly to another —O—O— group via one or more carbon atoms, or collection of such molecules. The organic peroxide may be a monoperoxide of formula $R^O$—O—O—$R^O$, wherein each $R^O$ independently is a ($C_1$-$C_{20}$) alkyl group or ($C_6$-$C_{20}$)aryl group. Each ($C_1$-$C_{20}$)alkyl group independently is unsubstituted or substituted with 1 or 2 ($C_6$-$C_{12}$)aryl groups. Each ($C_6$-$C_{20}$)aryl group is unsubstituted or substituted with 1 to 4 ($C_1$-$C_{10}$)alkyl groups. Alternatively, the organic peroxide may be a diperoxide of formula $R^O$—O—O—R—O—O—$R^O$, wherein R is a divalent hydrocarbon group such as a ($C_2$-$C_{10}$)alkylene, ($C_3$-$C_{10}$)cycloalkylene, or phenylene, and each $R^O$ is as defined above. Suitable organic peroxides include but not limited to alkyl peroxides, aryl peroxides, peroxyesters, peroxycarbonates, diacylperoxides, peroxyketals, cyclic peroxides, dialkyl peroxides, peroxy esters, peroxy dicarbonates, or combinations of two or more thereof.

Examples of suitable organic peroxides include but are not limited to dicumyl peroxide; lauryl peroxide; benzoyl peroxide; tertiary butyl perbenzoate; di(tertiary-butyl) peroxide; cumene hydroperoxide; 2,5-dimethyl-2,5-di(t-butyl-peroxy)hexyne-3; 2,-5-di-methyl-2,5-di(t-butyl-peroxy) hexane; tertiary butyl hydroperoxide; isopropyl percarbonate; alpha,alpha'-bis(tertiary-butylperoxy)diisopropylbenzene; t-butylperoxy-2-ethylhexyl-monocarbonate; 1,1-bis(t-butylperoxy)-3,5,5-trimethyl cyclohexane; 2,5-dimethyl-2,5-dihydroxyperoxide; t-butylcumylperoxide; alpha,alpha'-bis(t-butylperoxy)-p-diisopropyl benzene; bis (1,1-dimethylethyl) peroxide; bis(1,1-dimethylpropyl) peroxide; 2,5-dimethyl-2,5-bis(1,1-dimethylethylperoxy) hexane; 2,5-dimethyl-2,5-bis(1,1-dimethylethylperoxy) hexyne; 4,4-bis(1,1-dimethylethylperoxy) valeric acid; butyl ester; 1,1-bis(1,1-dimethylethylperoxy)-3,3,5-trimethylcyclohexane; benzoyl peroxide; tert-butyl peroxybenzoate; di-tert-amyl peroxide ("DTAP"); bis(alpha-t-butyl-peroxyisopropyl) benzene ("BIPB"); isopropylcumyl t-butyl peroxide; t-butylcumylperoxide; di-t-butyl peroxide; 2,5-bis(tbutylperoxy)-2,5-dimethylhexane; 2,5-bis(t-butylperoxy)-2,5-dimethylhexyne-3, 1,1-bis(tbutylperoxy)-3,3,5-trimethylcyclohexane; isopropylcumyl cumylperoxide; butyl 4,4-di(tertbutylperoxy) valerate; di(isopropylcumyl) peroxide; and combinations thereof.

Non-limiting examples of suitable commercially available organic peroxides include TRIGONOX® from AkzoNobel and LUPEROX® TBEC from ARKEMA.

Silane Coupling Agent

In some embodiments, the silane coupling agent contains at least one alkoxy group. Non-limiting examples of suitable silane coupling agents include γ-chloropropyl trimethoxysilane, vinyl trimethoxysilane, vinyl triethoxysilane, vinyl-tris-(β-methoxy)silane, allyltrimethoxysilane, γ-methacryloxypropyl trimethoxysilane, β-(3,4-ethoxy-cyclohexyl) ethyl trimethoxysilane, γ-glycidoxypropyl trimethoxysilane, γ-mercaptopropyltrimethoxysilane, γ-aminopropyl trimethoxysilane, N-β-(aminoethyl)-γ-aminopropyl trimethoxysilane, and 3-(trimethoxysilyl)propylmethacrylate, vinyl triacetoxysilane, γ-(meth)acryloxy, propyl trimethoxysilane, and combinations thereof.

In some embodiments, the silane coupling agent is vinyl trimethoxysilane (VTMS) or 3-(trimethoxysilyl)propyl-methacrylate (VMMS) or allyltrimethoxysilane.

Crosslinking Co-Agent

The crosslinking co-agent can be any one, or a mixture, of co-agents, including, but not limited to, an ester, ether, ketone, cyanurate, isocyanurate, phosphate, ortho formate, aliphatic or aromatic ether containing at least 2, and preferably 3, unsaturated groups such as allyl, vinyl or acrylate. The number of carbon atoms in the co-agent can be in the range of 9 to 40 or more, and is preferably 9 to 20.

Specific examples of co-agents include, but are not limited to, triallyl cyanurate (TAC); triallyl-1,3,5-triazine-2,4, 6(1H,3H,5H)-trione also known as triallyl isocyanturate (TAIC); hexaallyl melamine; triallyl phosphate (TAP); triallyl ortho formate; tetra-allyloxy-ethane; triallyl benzene-1,3,5-tricarboxylate; diallyl phthalate; zinc dimethacrylate; ethoxylated bisphenol A dimethacrylate; methacrylate terminated monomer with average chain length of C14 or C15; pentaerythritol tetraacrylate; depentaerythritol pentaacrylate; pentaerythritol triacrylate; dimethylolpropane tetraacrylate; ethoxylated trimethylolpropane triacrylate; trimethylolpropane triacrylate; 2,4,6-triallyl-1,3,5-trione; 2,4-diphentyl-4-methyl-1-pentene; triallyl trimellitate (TATM); 3,9-divinyl-2,4,8,10-tetra-oxaspiro[5.5]undecane (DVS); alpha-methyl styrene dimer (AMSD); and combinations thereof.

In certain embodiments, the crosslinking co-agent may be selected from the group consisting of TAIC, TAC, TAP, vinyl cyclic siloxanes, and combinations thereof.

Additive Component

The curable compositions of the present disclosure may contain one or more additives. Non-limiting examples of suitable additives include other polymers, metal oxides, antioxidants, fillers, UV stabilizers, flame retardants, plasticizers or oils, colorants or pigments, tackifiers, reinforcing agents, fatty acids and salts thereof, ignition resistant additives, scorch inhibitors, stabilizers, blowing agents, lubricants, processing aids, extrusion aids, nucleating agents, scavengers, waxes, curing additives, accelerants, and combinations thereof.

In certain embodiments, the curable compositions of the present disclosure comprises an additive component comprising an antioxidant and/or a UV stabilizer. Accordingly, the additive component may comprise a UV stabilizer. Or, the additive component may comprise an antioxidant. Further, the additive component may comprise an antioxidant and a UV stabilizer.

Non-limiting examples of suitable UV stabilizers include hindered phenols, phophites, hindered amine light stabilizers (HALS), UV absorbers, hindered benzoates, and combinations of these. Suitable UV stabilizers include but are not limited to T770 available from TCI; UV 531 available from TCI; Cynergy A400, A430 and R350; Cyasorb UV-3529; Cyasorb UV-3346; Cyasorb UV-3583; Hostavin N30; Univil 4050; Univin 5050; Chimassorb UV-119; Chimassorb 944 LD; Tinuvin 622 LD; benzophenones, benzotriazoles, triazines, and combinations of these, such as Tinuvin 328 or Cyasorb UV-1164; and the like.

Suitable antioxidants include but are not limited to those selected from the group consisting of Cyanox 2777; Irganox 1010; Irganox 1076; Irganox B215; Irganox B225; PEPQ; Weston 399; TNPP; Irgafos 168; and Devoerphos 9228.

Curable Composition

The present disclosure relates to a curable composition for an encapsulant film, the curable composition comprising: (A) a polyolefin; (B) a fumed alumina; (C) an organic peroxide; (D) a silane coupling agent; (E) a crosslinking co-agent; and, optionally (F) an additive component comprising an antioxidant and/or a UV stabilizer, wherein the polyolefin has a volume resistivity of less than $4.0E+15$ ohm·cm.

The (A) polyolefin having a volume resistivity of less than $4.0E+15$ ohm·cm may be present in the curable composition in an amount from 80 wt % to 99 wt %, or from 85 wt % to 99 wt %, or from 90 wt % to 99 wt %, or from 95 wt % to 99 wt %, based on the total weight of the curable composition.

The (B) fumed alumina may be present in the curable composition in an amount from 0.01 wt % to 5 wt %, or from 0.05 wt % to 2 wt %, or from 0.1 wt % to 1 wt %, or from 0.25 wt % to 1 wt %, based on the total weight of the curable composition.

The (C) organic peroxide may be present in the curable composition in an amount from 0.1 wt % to 5 wt %, or from 0.1 wt % to 3 wt %, or from 0.5 wt % to 2 wt %, based on the total weight of the curable composition.

The (D) silane coupling agent may be present in the curable composition in an amount from 0.01 wt % to 2 wt %, or from 0.05 wt % to 1 wt %, or from 0.1 wt % to 0.5 wt %, based on the total weight of the curable composition.

The (E) crosslinking co-agent may be present in the curable composition in an amount from 0.01 wt % to 5 wt %, or from 0.1 wt % to 3 wt %, or from 0.2 wt % to 1 wt %, based on the total weight of the curable composition.

The (F) additive component comprising an antioxidant and/or a UV stabilizer may be present in the curable composition in an amount from 0 wt % to 5 wt %, or from 0 wt % to 3 wt %, or from 0 wt % to 1 wt %, or from 0.01 wt % to 1 wt %, based on the total weight of the curable composition.

In certain embodiments, the curable composition of the present disclosure may further comprise one or more polymers other than the (A) polyolefin. That is, the (A) polyolefin may blended with one or more polymers. Accordingly, the curable composition of the present disclosure (as well as the crosslinked polymer composition comprising the reaction product of the curable composition) may further comprise one or more polymers, including but not limited to unsaturated polyolefins (another EPDM, polybutadiene, etc.), saturated polyolefins (PE, PP, ethylene/alpha-olefin interpolymers, propylene/alpha-olefin interpolymers, olefin block copolymers, etc.), other elastomers (SBCs, PVC, EVA, etc.) and other engineering thermoplastics (styrenics, polyamides, polyesters, etc.).

In certain embodiments, the polyolefin is not blended with other polymers. In certain embodiments, the curable composition is absent (or does not comprise of) any polymers other than the (A) polyolefin.

The curable composition of the present disclosure may be cured to form a crosslinked polymeric composition. The crosslinked polymeric composition is the reaction product of the curable composition that results from curing.

In some embodiments, the crosslinked polymeric composition has, in accordance with the methods disclosed herein or similar methods, a volume resistivity greater than $1.0E+15$ ohm·cm, or greater than $5.0E+15$ ohm·cm, or greater than or equal to $9.0E+15$ ohm·cm, or greater than or equal to $1.0E+16$ ohm·cm, or greater than or equal to $2.0E+16$ ohm·cm, or greater than or equal to $5.0E+16$ ohm·cm, or greater than or equal to $8.0E+16$ ohm·cm, or greater than or equal to $1.0E+17$ ohm·cm, or greater than or equal to $5.0E+17$ ohm·cm, or greater than or equal to $1.0E+18$ ohm·cm, or greater than or equal to $1.0E+19$ ohm·cm.

In further embodiments, the crosslinked polymeric composition has, in accordance with the methods disclosed herein or similar methods, a volume resistivity from $1.0E+15$ ohm·cm, or $5.0E+15$ ohm·cm, or $9.0E+15$ ohm·cm to $1.0E+16$ ohm·cm, or $2.0E+16$ ohm·cm, or $5.0E+16$ ohm·cm, or $8.0E+16$ ohm·cm, or $9.0E+16$ ohm·cm, or $1.0E+17$ ohm·cm, or $5.0E+17$ ohm.com, or $1.0E+18$ ohm·cm, or $1.0E+19$ ohm·cm. For example, in certain embodiments, the crosslinked polymeric composition has a volume resistivity from greater than $1.0E+15$ ohm·cm to $1.0E+19$ ohm·cm, or from greater than $1.0E+15$ ohm·cm to $1.0E+18$ ohm·cm, or from greater than $1.0E+15$ ohm·cm to $5.0E+17$ ohm·cm, or from greater than $1.0E+15$ ohm·cm to $1.0E+17$ ohm·cm, or from greater than $5.0E+15$ ohm·cm to $1.0E+17$, or from greater than $9.0E+15$ ohm·cm to $9.0E+16$ ohm·cm.

Each of the curable composition and the crosslinked polymeric composition may have any combination of embodiments described herein.

Encapsulant Films or Film Layers

The present disclosure provides an encapsulant film or film layer that may be incorporated in an electronic device, such as a PV module. The encapsulant film or film layer is made from the curable composition or crosslinked polymeric composition described herein. In certain embodiments, the present disclosure relates to an encapsulant film or film layer comprising a crosslinked polymeric composition that is the reaction product of a curable composition comprising: (A) a polyolefin; (B) a fumed alumina; (C) an organic peroxide; (D) a silane coupling agent; (E) a crosslinking co-agent; and, optionally (F) an additive component comprising an antioxidant and/or a UV stabilizer, wherein the polyolefin has a volume resistivity of less than $4.0E+15$ ohm·cm. In certain embodiments, the encapsulant film or film layer is the crosslinked polymeric composition.

In further embodiments, the present disclosure relates to an encapsulant film or film layer comprising a crosslinked polymeric composition that is the reaction product of a curable composition comprising: (A) from 80 wt % to 99 wt %, or from 85 wt % to 99 wt %, or from 90 wt % to 99 wt %, or from 95 wt % to 99 wt % of a polyolefin having a volume resistivity of less than 4.0E+15 ohm·cm, based on the total weight of the curable composition; (B) from 0.01 wt % to 5 wt %, or from 0.05 to 2 wt %, or from 0.1 wt % to 1 wt %, or from 0.25 wt % to 1 wt % of a fumed alumina, based on the total weight of the curable composition; (C) from 0.1 wt % to 5 wt %, or from 0.1 wt % to 3 wt %, or from 0.5 wt % to 2 wt % of an organic peroxide, based on the total weight of the curable composition; (D) from 0.01 wt % to 2 wt %, or from 0.05 wt % to 1 wt %, or from 0.1 wt % to 0.5 wt % of a silane coupling agent, based on the total weight of the curable composition; (E) from 0.01 wt % to 5 wt %, or from 0.1 wt % to 3 wt %, or from 0.2 wt % to 1 wt % of a crosslinking co-agent, based on the total weight of the curable composition; and (F) from 0 wt % to 5 wt %, or from 0 wt % to 3 wt %, or from 0 wt % to 1 wt %, or from 0.01 wt % to 1 wt % of an additive component comprising an antioxidant and/or a UV stabilizer, based on the total weight of the curable composition.

The encapsulant film or film layer may be formed by any means known in the art. In some embodiments, the encapsulant film or film layer is prepared by extruding some or all components of the curable composition via various types of mixers or extruders, such as single or twin screw types, followed by curing or crosslinking during molding and/or lamination. A typical extruder has a hopper at its upstream end and a die at its downstream end. Components of the curable composition may be fed to the hopper, and then melted and extruded at a temperature less than 120° C. so as to not initiate curing or crosslinking. In certain embodiments, extrusion may be performed at a temperature from 85° C. to 115° C. at a rotor speed from 20 rpm to 40 rpm.

The components (A) to (F) of the curable composition may be added to or combined with each other in any order prior to curing or crosslinking. For example, components (B) to (F) may each be gradually added to the (A) polyolefin in an extruder. In some embodiments, the (A) polyolefin may be soaked with components (C) to (E) prior to extrusion during which the other components may be added. In further embodiments, the (A) polyolefin may be mixed or extruded with components (B) and (F) followed by soaking with components (C) to (E).

It is desirable to avoid or limit curing or crosslinking of the curable composition until the steps following extrusion. Premature curing or crosslinking may result in the encapsulant film or film layer having decreased glass adhesion. Accordingly, in certain embodiments, curing or crosslinking the curable composition occurs after extrusion and during molding and/or lamination at elevated temperatures (such as greater than 120° C. to 160° C.). In other words, the encapsulant film remains active until molding and/or lamination, at which point curing or crosslinking is initiated resulting in the encapsulant film or film layer comprising a crosslinked polymeric composition which is the reaction product of a curable composition comprising: (A) a polyolefin having a volume resistivity of less than 4.0E+15 ohm·cm; (B) a fumed alumina; (C) an organic peroxide; (D) a silane coupling agent; (E) a crosslinking co-agent; and, optionally (F) an additive component comprising an antioxidant and/or a UV stabilizer.

The encapsulant film or film layer may have any thickness that is suitable for its inclusion in an electronic device, such as a PV module. In certain embodiments, the encapsulant film or film layer has a thickness from 100 µm, or 150 µm, or 200 µm, or 250 µm, or 300 µm, or 350 µm, or 400 µm to 450 µm, or 500 µm, or 550 µm, or 600 µm, or 650 µm, or 700 µm, or 800 µm.

In some embodiments, the encapsulant film or film layer of the present disclosure has, in accordance with the methods disclosed herein or similar methods, a volume resistivity of greater than 1.0E+15 ohm·cm, or greater than 5.0E+15 ohm·cm, or greater than or equal to 9.0E+15 ohm·cm, or greater than or equal to 1.0E+16 ohm·cm, or greater than or equal to 2.0E+16 ohm·cm, or greater than or equal to 5.0E+16 ohm·cm, or greater than or equal to 8.0E+16 ohm·cm, or greater than or equal to 1.0E+17 ohm·cm, or greater than or equal to 5.0E+17 ohm·cm, or greater than or equal to 1.0E+18 ohm·cm, or greater than or equal to 1.0E+19 ohm·cm.

In further embodiments, the encapsulant film or film layer of the present disclosure has, in accordance with the methods disclosed herein or similar methods, a volume resistivity from 1.0E+15 ohm·cm, or 5.0E+15 ohm·cm, or 9.0E+15 ohm·cm to 1.0E+16 ohm·cm, or 2.0E+16 ohm·cm, or 5.0E+16 ohm·cm, or 8.0E+16 ohm·cm, or 9.0E+16 ohm·cm, or 1.0E+17 ohm·cm, or 5.0E+17 ohm·com, or 1.0E+18 ohm·cm, or 1.0E+19 ohm·cm. For example, the encapsulant film or film layer has a volume resistivity from greater than 1.0E+15 ohm·cm to 1.0E+19 ohm·cm, or from greater than 1.0E+15 ohm·cm to 1.0E+18 ohm·cm, or from greater than 1.0E+15 ohm·cm to 5.0E+17 ohm·cm, or from greater than 1.0E+15 ohm·cm to 1.0E+17 ohm·cm, or from greater than 5.0E+15 ohm·cm to 1.0E+17, or from greater than 9.0E+15 ohm·cm to 9.0E+16 ohm·cm.

In certain embodiments, the encapsulant film or film layer of the present disclosure has a maximum torque (MH) greater than or equal to 2.0 dNm, or greater than or equal to 2.5 dNm, or greater than or equal to 3.0 dNm, or greater than or equal to 3.5 dNm, or greater than or equal to 3.6 dNm, or greater than or equal to 3.7 dNm.

In further embodiments, the encapsulant film or film layer has a t90 less than 15 minutes, or less than 13 minutes, or less than 11 minutes, or less than 10.9 minutes, or less than or equal to 10.8 minutes, or less than or equal to 10.7 minutes.

In some embodiments, the encapsulant film or film layer has an initial glass adhesion greater than 100 N/cm, or greater than 110 N/cm, or greater than 120 N/cm, or greater than 130 N/cm, or greater than 140 N/cm, or greater than 145 N/cm, or greater than or equal to 146 N/cm, or greater than or equal to 149 N/cm, or greater than or equal to 150 N/cm. In certain embodiments, the encapsulant film or film layer has, in accordance with the methods disclosed herein or similar methods, an initial glass adhesion from greater than 100 N/cm to 200 N/cm, or from greater than 100 N/cm to 180 N/cm, or from greater than 100 N/cm to 160 N/cm, or from greater than 120 N/cm to 160 N/cm, or from greater than 130 N/cm to 150 N/cm.

In certain embodiments, the encapsulant film or film layer has, in accordance with the methods disclosed herein or similar methods, a mean transmittance greater than or equal to 88%, or greater than or equal to 88.5%, or greater than or equal to 89%, or greater than or equal to 89.5%, or greater than or equal to 90%.

The encapsulant film or film layer of the present disclosure may be any combination of embodiments disclosed herein.

Electronic Device

The encapsulant film of the present disclosure may be incorporated in the construction of an electronic device, such as a PV module. The encapsulant film may be used as one or more layers for a PV module. The encapsulant film may be applied to one or both face surfaces of an electronic device, e.g., as a front encapsulant film or rear encapsulant film, or as both the front encapsulant film and the rear encapsulant film, e.g., in which the electronic device is totally enclosed within the material.

A "photovoltaic module" or "PV module" is a laminated structure that may include the following layer components but is not limited in such way:

1. Light receiving and transmitting layer;
2. A front encapsulant film layer (transparent);
3. One or more photovoltaic cell;
4. A rear encapsulant film layer; and
5. A backseet.

In an embodiment, the light receiving and transmitting layer is glass, acrylic resin, polycarbonate, polyester or fluorine-containing resin. In an embodiment, the light receiving and transmitting layer is glass.

The number of photovoltaic cells in a given photovoltaic module will vary depending on the nature and use of the electronic device utilizing the photovoltaic module. In an embodiment, at least one photovoltaic cell is in direct contact with the front encapsulant film layer and rear encapsulant film layer.

In an embodiment, the backsheet is a polymer backsheet or a glass backsheet.

The layers (1)-(5) of the PV module with laminated structure described above are bonded through lamination. Through lamination, the top sheet is brought into direct contact with the front encapsulant film layer, and the backsheet is brought into direct contact with the rear encapsulant film layer. The photovoltaic cells are secured between, and in direct contact with, the front encapsulant film layer and the rear encapsulant film layer. As a result, portions of the front encapsulant film and the rear encapsulant film are in direct contact with each other.

In an embodiment, the present disclosure provides a PV module. The PV module includes an encapsulant film layer of the present disclosure. The film layer of the present disclosure can be a front encapsulant film layer, a rear encapsulant film layer, a backsheet film layer, and combinations thereof. In other embodiments, the present film layer can be the entire film, or are or more discrete sublayers of a film.

In an embodiment, both the front encapsulant film layer and the rear encapsulant film layer are film layers as disclosed herein. Each of the front encapsulant film layer and the rear encapsulant film layer directly contact the photovoltaic cell. A portion of the front encapsulant film layer also directly contacts a portion of the rear encapsulant film layer. The front encapsulant film layer and the rear encapsulant film layer can be as previously described.

In an embodiment, the film layer(s) comprising the compositions of this disclosure are applied to an electronic device by one or more lamination techniques. Through lamination, the cover sheet is brought in direct contact with a first facial surface of the encapsulant film layer, and the electronic device is brought in direct contact with a second facial surface of the encapsulant film layer. In another embodiment, the cover sheet is brought into direct contact with a first facial surface of the front encapsulant film layer, the back sheet is brought in direct contact with a second facial surface of the rear encapsulant film layer, and the electronic device(s) is secured between, and in direct contact with the second facial surface of the front encapsulant film layer and the first facial surface of the rear encapsulant film layer.

In an embodiment, the lamination temperature is sufficient to activate the organic peroxide and crosslink the curable composition, that is, the curable composition comprising (A) a polyolefin having a volume resistivity less than 4.0E+15 ohm·cm, (B) a fumed alumina, (C) an organic peroxide, (D) a silane coupling agent, (E) a crosslinking co-agent, and, optionally, (F) an additive component comprising an antioxidant and/or a UV stabilizer, such as disclosed herein remains reactive until lamination when crosslinking occurs. After lamination, the crosslinked polymeric composition is formed as a reaction product of the curable composition comprising (A) a polyolefin having a volume resistivity less than 4.0E+15 ohm·cm, (B) a fumed alumina, (C) an organic peroxide, (D) a silane coupling agent, (E) a crosslinking co-agent, and, optionally, (F) an additive component comprising an antioxidant and/or a UV stabilizer.

In an embodiment, the lamination temperature for producing an electronic device is from 130° C., or 135° C., or 140° C., or 145° C. to 150° C., or 155° C., or 160° C. In an embodiment, the lamination time is from 8 minutes, or 10 minutes, or 12 minutes, or 15 minutes to 18 minutes, or 20 minutes, or 22 minutes, or 25 minutes.

Specific embodiments of the present disclosure include but are not limited to the following:

1. A curable composition for an encapsulant film, the curable composition comprising: (A) a polyolefin; (B) a fumed alumina; (C) an organic peroxide; (D) a silane coupling agent; (E) a crosslinking co-agent; and, optionally, (F) an additive component comprising an antioxidant and/or a UV stabilizer, wherein the polyolefin has a volume resistivity of less than 4.0E+15 ohm·cm.

2. The curable composition of embodiment 1, wherein the curable composition comprises:
   (A) from 80 wt % to 99 wt %, or from 85 wt % to 99 wt %, or from 90 wt % to 99 wt %, or from 95 wt % to 99 wt % of the polyolefin, based on the total weight of the curable composition;
   (B) from 0.01 wt % to 5 wt %, or from 0.05 to 2 wt %, or from 0.1 wt % to 1 wt %, or from 0.25 wt % to 1 wt % of the fumed alumina, based on the total weight of the curable composition;
   (C) from 0.1 wt % to 5 wt %, or from 0.1 wt % to 3 wt %, or from 0.5 wt % to 2 wt % of the organic peroxide, based on the total weight of the curable composition;
   (D) from 0.01 wt % to 2 wt %, or from 0.05 wt % to 1 wt %, or from 0.1 wt % to 0.5 wt % of the silane coupling agent, based on the total weight of the curable composition;
   (E) from 0.01 wt % to 5 wt %, or from 0.1 wt % to 3 wt %, or from 0.2 wt % to 1 wt %, based on the total weight of the curable composition; and
   (F) from 0 wt % to 5 wt %, or from 0 wt % to 3 wt %, or from 0 wt % to 1 wt %, or from 0.01 wt % to 1 wt % of a UV stabilizer, based on the total weight of the curable composition.

3. The curable composition of embodiment 1 or 2, wherein the polyolefin has a volume resistivity from greater than 1.0E+12 ohm·cm to less than 4.0E+15 ohm·cm, or from greater than 5.0E+12 ohm·cm to less than 4.0E+15 ohm·cm, or from greater than 1.0E+13 ohm·cm to less than 4.0E+15 ohm·cm, or from greater than 5.0E+13 ohm·cm to less than 4.0E+15 ohm·cm, or from greater than or equal to 1.0E+14 ohm·cm to less than 4.0E+15 ohm·cm, or from greater than or equal to 5.0E+14 ohm·cm to less than 4.0E+15 ohm·cm, or from greater than or equal to 5.0E+14 ohm·cm to less than or equal to 3.5E+15 ohm·cm, or from greater than or equal to 7.0E+14 ohm·cm to less than or equal to 3.0E+15 ohm·cm.

4. The curable composition of any of the previous embodiments, wherein the polyolefin has a density from 0.850 g/cc to 0.920 g/cc, or from 0.855 g/cc to 0.910 g/cc, or from 0.860 g/cc to 0.900 g/cc, or from 0.860 g/cc to 0.895 g/cc, or from 0.860 g/cc to 0.890 g/cc, or from 0.865 g/cc to 0.885 g/cc, or from 0.865 g/cc to 0.880 g/cc, as measured in accordance with ASTM D792, Method B.

5. The curable composition of any of the previous embodiments, wherein the polyolefin has a melt index from 0.1 g/10 min to 100 g/10 min, or from 0.5 g/10 min to 100 g/10 min, or from 1 g/10 min to 100 g/10 min, or from 1 g/10 min to 75 g/10 min, or from 1 g/10 min to 50 g/10 min, or from 1 g/10 min to 30 g/10 min, or from 5 g/10 min to 30 g/10 min, or from 5 g/10 min to 20 g/10 min, as measured in accordance with ASTM D1238, at 190° C./2.16 kg.

6. The curable composition of any of the previous embodiments, wherein the polyolefin has a melting point (Tm) from 55° C., or 60° C., or 75° C., or 90° C., or 95° C., or 100° C. to 105° C., or 110° C., as measured using DSC.

7. The curable composition of any of the previous embodiments, wherein the polyolefin has a glass transition temperature, Tg, from −30° C., or −35° C. to −40° C., or −45° C., or −50° C., or −60° C., as measured using DSC.

8. The curable composition of any of the previous embodiments, wherein the polyolefin has a flexural modulus (2% secant) from greater than or equal to 500 psi, or greater than or equal to 750 psi, or greater than or equal to 1000 psi to 2000 psi, or 3000 psi, or 3500 psi, or 4000 psi, or less than 6000 psi, as measured in accordance with ASTM D790.

9. The curable composition of any of the previous embodiments, wherein the polyolefin is an ethylene/alpha-olefin interpolymer.

10. The curable composition of any of the previous embodiments, wherein the polyolefin is an ethylene/alpha-olefin copolymer.

11. The curable composition of any of the previous embodiments, wherein the polyolefin is an ethylene/alpha-olefin random copolymer.

12. The curable composition of any of the previous embodiments, wherein the polyolefin is an ethylene/1-octene copolymer.

13. The curable composition of any of the previous embodiments, wherein the fumed alumina is hydrophilic.

14. The curable composition of any of the previous embodiments, wherein the fumed alumina has a specific surface area (BET) from greater than 50 $m^2/g$ to less than 200 $m^2/g$, or from 55 $m^2/g$ to 150 $m^2/g$, or from 60 $m^2/g$ to 140 $m^2/g$, or from 65 $m^2/g$ to 130 $m^2/g$.

15. The curable composition of any of the previous embodiments, wherein the organic peroxide is selected from the group consisting of tert-Butylperoxy 2-ethylhexyl carbonate, dicumyl peroxide, lauryl peroxide, benzoyl peroxide, tertiary butyl perbenzoate, di(tertiary-butyl) peroxide, cumene hydroperoxide, 2,5-dimethyl-2,5-di(t-butyl-peroxy) hexyne-3, 2,-5-di-methyl-2,5-di(t-butyl-peroxy)hexane, tertiary butyl hydroperoxide, isopropyl percarbonate, alpha, alpha'-bis(tertiary-butylperoxy)diisopropylbenzene, 1,1-bis (t-butylperoxy)-3,5,5-trimethyl cyclohexane, 2,5-dimethyl-2,5-dihydroxyperoxide, t-butylcumylperoxide, alpha,alpha'-bis(t-butylperoxy)-p-diisopropyl benzene, and combinations thereof.

16. The curable composition of any of the previous embodiments, wherein the silane coupling agent is selected from the group consisting of 3-(trimethoxysilyl)propylmethacrylate, vinyl trimethoxysilane, allyltrimethoxysilane, and combinations thereof.

17. The curable composition of any of the previous embodiments, wherein the cross-linking co-agent is selected from the group consisting of triallyl isocyanurate, triaryl cyanurate, triallyl phosphate, and combinations thereof.

18. An encapsulant film comprising a crosslinked polymeric composition that is the reaction product of the curable composition of any of the previous embodiments.

19. An encapsulant film comprising the curable composition of any of embodiments 1-17.

20. An encapsulant film comprising the reaction product of the curable composition of any embodiments 1-17.

21. The encapsulant film of any of embodiments 18-20, wherein the encapsulant film has a volume resistivity greater than 1.0E+15 ohm·cm, or greater than 5.0E+15 ohm·cm, or greater than or equal to 9.0E+15 ohm·cm, or greater than or equal to 1.0E+16 ohm·cm, or greater than or equal to 2.0E+16 ohm·cm, or greater than or equal to 5.0E+16 ohm·cm, or greater than or equal to 8.0E+16 ohm·cm, or greater than or equal to 1.0E+17 ohm·cm, or greater than or equal to 5.0E+17 ohm·cm, or greater than or equal to 1.0E+18 ohm·cm, or greater than or equal to 1.0E+19 ohm·cm.

22. The encapsulant film of any of embodiments 18-21, wherein the encapsulant film has a volume resistivity from greater than 1.0E+15 ohm·cm to 1.0E+19 ohm·cm, or from greater than 1.0E+15 ohm·cm to 1.0E+18 ohm·cm, or from greater than 1.0E+15 ohm·cm to 5.0E+17 ohm·cm, or from greater than 1.0E+15 ohm·cm to 1.0E+17 ohm·cm, or from greater than 5.0E+15 ohm·cm to 1.0E+17, or from greater than 9.0E+15 ohm·cm to 9.0E+16 ohm·cm.

23. The encapsulant film of any of embodiments 18-22, wherein the encapsulant film has a maximum torque (MH) greater than or equal to 2.0 dNm, or greater than or equal to 2.5 dNm, or greater than or equal to 3.0 dNm, or greater than or equal to 3.5 dNm, or greater than or equal to 3.6 dNm, or greater than or equal to 3.7 dNm.

24. The encapsulant film of any of embodiments 18-23, wherein the encapsulant film has has a t90 less than 15 minutes, or less than 13 minutes, or less than 11 minutes, or less than 10.9 minutes, or less than or equal to 10.8 minutes, or less than or equal to 10.7 minutes.

25. The encapsulant film of any of embodiments 18-24, wherein the encapsulant film has an initial glass adhesion from greater than 100 N/cm to 200 N/cm, or from greater than 120 N/cm to 180 N/cm, or from greater than 130 N/cm to 170 N/cm, or from greater than 130 N/cm to 150 N/cm, or greater than 100 N/cm, or greater than 110 N/cm, or greater than 120 N/cm, or greater than 130 N/cm, or greater than 140 N/cm, or greater than 145 N/cm, or greater than or equal to 146 N/cm, or greater than or equal to 149 N/cm, or greater than or equal to 150 N/cm.

26. The encapsulant film of any of embodiments 18 to 25, wherein the encapsulant film has a mean transmittance greater than or equal to 88%, or greater than or equal to 88.5%, or greater than or equal to 89%, or greater than or equal to 89.5%, or greater than or equal to 90%.

27. A PV module comprising a solar cell and the encapsulant film of any of embodiments 18-26.

28. A PV module comprising a solar cell and at least one layer that is the encapsulant film of any of embodiments 18-26.

EXAMPLES

Materials

The materials used in the following examples are described below.

"POE 1": An ethylene/1-octene copolymer that is available as ENGAGE™ 8411 from The Dow Chemical Company and has: a density of 0.880 g/cc (ASTM D792); a melt index of 18.0 g/10 min (ASTM D1238 at 190° C./2.16 kg); a Tm of 76° C.; and a 2% secant=20.5 Mpa. POE 1 used herein (and available upon request from The Dow Chemical Company) has a volume resistivity of 1.0E+15 ohm·cm, in accordance with the methods disclosed herein.

"POE A": An ethylene/1-octene copolymer that is available from The Dow Chemical Company and has: a density of 0.880 g/cc (ASTM D792) and a melt index of 18.0 g/10 min (ASTM D1238 at 190° C./2.16 kg); a Tm of 76° C.; and a 2% secant=20.5 Mpa and a volume resistivity of 4.0E+16 ohm·cm in accordance with the methods disclosed herein.

"Peroxide": Tert-Butylperoxy 2-ethylhexyl carbonate (TBEC) available from J&K Scientific Ltd.

"Coagent": Triallyl isocyanurate (TAIC) available from Fangruida Chemicals Co., Ltd.

"Alumina 1": Fumed alumina available as Aeroxide® Alu 130 from Evonik Industries.

"Alumina 2": Fumed alumina available as Aeroxide® Alu 65 from Evonik Industries.

"Silica": A fumed silica available as Aerosil® R812S from Evonik Industries.

"UV Stabilizer": Bis(2,2,6,6-tetramethyl-4-piperidyl) Sebacate available as T770 from TCI.

Silane Coupling Agent ("Silane"): 3-(trimethoxysilyl) propylmethacrylate available as VMMS from Dow Corning.

Sample Preparation

Each of the comparative samples (CS1 to CS6) and inventive examples (IE1 to IE4) are prepared as described below and in accordance with the formulations of Table 1.

Ethylene/1-octene copolymer pellets are fed into a Brabender mixer at a temperature of 130° C. with a rotor speed of 10 rpm. Fumed alumina or fumed silica (depending on the formulations of Table 1) are then added. The final mixing is conducted at 130° C. and a rotor speed of 80 rpm for 5 minutes. The resulting compound is collected and cut into small pieces.

The small pieces of ethylene/1-octene copolymer and alumina/silica (or, if no alumina or silica is added, just ethylene/1-octene copolymer) are fed into the hopper of a Brabender single extruder. The small pieces are extruded to melt stand at 110° C. with a screw speed of 25 rpm. The melt strand is fed into the Brabender pelletizer to prepare pellets.

The silane coupling agent, organic peroxide, co-agent, and any additional additives, such as UV stabilizer and/or antioxidant, are weighed and mixed in a sealable plastic bottle in accordance with Table 1, below. The pellets are weighed in accordance with Table 1 and added to the plastic bottle. To ensure a homogenous distribution, and complete soaking, the plastic bottle was first tumbled for 1 minute and then placed on a running roller for further homogenization in an oven at 40° C. for 15-20 hours before using.

Film Preparation

After soaking, the pellets are fed into a Brabender single screw mixer at 105° C. with a rotor speed of 30 rpm. Films with a thickness of approximately 0.5 mm are prepared and stored in sealed aluminum foil bags for testing.

Compression Molding

Cast films are compression molded into a 0.5 mm film. The samples are placed in a mold, preheated to 120° C. for 5 minutes, and then degassed via 8 cycles of pressure loading/releasing. The degassed samples are then pressed at 150° C. for 15 minutes and cooled to room temperature. The compression molded sheets are used for the volume resistivity and transmittance tests.

Lamination

4"×6" glass plates are cleaned using water and dried before use. The backsheets are cut into four 6-inch squares. The film samples are cut into pieces to fit the size of the glass and backsheet. The backsheet, film samples, and glass are layered together to form a backsheet/film sample/glass structure and then laminated on a PENERGY L036 laminator at 150° C. for 20 minutes (4 minutes of vacuum and 16 minutes pressing). The laminated samples are used for the glass adhesion test.

TABLE 1

| Component | CE1 | CE2 | CE3 | IE1 | IE2 | IE3 | IE4 | CE4 | CE5 | CE6 |
|---|---|---|---|---|---|---|---|---|---|---|
| Sample Compositions (wt %) | | | | | | | | | | |
| POE 1 | 98.18 | 97.18 | — | 97.93 | 97.68 | 97.18 | 97.18 | — | — | — |
| POE A | — | — | 98.18 | — | — | — | — | 97.93 | 97.68 | 97.18 |
| Peroxide | 1.0 | 1.0 | 1.0 | 1.0 | 1.0 | 1.0 | 1.0 | 1.0 | 1.0 | 1.0 |
| Silane | 0.25 | 0.25 | 0.25 | 0.25 | 0.25 | 0.25 | 0.25 | 0.25 | 0.25 | 0.25 |
| Coagent | 0.5 | 0.5 | 0.5 | 0.5 | 0.5 | 0.5 | 0.5 | 0.5 | 0.5 | 0.5 |
| UV Stabilizer | 0.07 | 0.07 | 0.07 | 0.07 | 0.07 | 0.07 | 0.07 | 0.07 | 0.07 | 0.07 |
| Alumina 1 | — | — | — | 0.25 | 0.5 | 1.0 | — | 0.25 | 0.5 | 1.0 |
| Alumina 2 | — | — | — | — | — | — | 1.0 | — | — | — |
| Silica | — | 1.0 | — | — | — | — | — | — | — | — |
| Total (wt %) | 100 | 100 | 100 | 100 | 100 | 100 | 100 | 100 | 100 | 100 |
| Performance Results | | | | | | | | | | |
| MH/dNm | 3.63 | — | 3.05 | 3.76 | 3.68 | 3.66 | — | 2.91 | — | 2.65 |
| t90/min | 11.14 | — | 12.7 | 10.78 | 10.68 | 10.66 | — | 11.3 | — | 11.3 |
| Initial glass adhesion (N/cm) | 152.8 | — | 147.5 | 146.4 | — | 149.6 | — | 153.8 | — | 151.9 |
| Mean Transmittance (380-1100 nm)% | 90.89 | — | 91.23 | 90.08 | 89.39 | 88.51 | — | 90.60 | 89.74 | 88.78 |
| VR at RT (ohm · cm) | 7.73E+14 | 8.71E+14 | 4.28E+17 | 9.73E+15 | 2.37E+16 | 8.09E+16 | 1.50E+16 | 1.30E+18 | 1.20E+18 | 7.43E+17 |

Comparative Example 1 (CE1) is an encapsulant film based on an ethylene/alpha-olefin copolymer having a volume resistivity of 1.0E+15 ohm cm. As seen with Comparative Example 2 (CE2), the addition of fumed silica with the same level of additives does not provide for a significant VR improvement. Similarly, as seen with Comparative Examples 3-6 (CE3 to CE6), the addition of fumed alumina (with the same level of additives) based on an ethylene/alpha-olefin copolymer having a higher VR (a volume resistivity of 4.0E+16 ohm cm) does not provide for significant VR improvement.

In contrast, Inventive Examples 1-4 (IE1 to IE4) surprisingly show that the addition of fumed alumina with the same level of additives provide for significant VR improvement while maintaining other key properties, such as good curing performance and good adhesion performance Indeed, IE1 to IE4 show a VR improvement by greater than 10 times and even as much as greater than 100 times (2 orders of magnitude) while also maintaining similar or comparable curing and adhesion performance as CE1. This tremendous improvement of VR for a formulation based on an ethylene/alpha-olefin copolymer having a low VR without affecting curing and adhesion is surprising and unexpected.

What is claimed is:

1. A curable composition for an encapsulant film, the curable composition comprising:
   (A) from 80 wt % to 99 wt % of an ethylene/1-octene random copolymer with a density from 0.860 g/cc to 0.890 g/cc, and a melt index from 5 g/10 min to 20 g/10 min, based on the total weight of the curable composition;
   (B) from 0.01 wt % to 5 wt % of a fumed alumina with a specific surface area (BET) from greater than 50 $m^2/g$ to less than 200 $m^2/g$, based on the total weight of the curable composition;
   (C) from 0.1 wt % to 5 wt % of an organic peroxide, based on the total weight of the curable composition;
   (D) from 0.01 wt % to 2 wt % of a silane coupling agent, based on the total weight of the curable composition;
   (E) from 0.01 wt % to 5 wt % of a cross-linking co-agent, based on the total weight of the curable composition; and
   (F) from 0 wt % to 1 wt % of an additive component comprising an antioxidant, based on the total weight of the curable composition,
   wherein the ethylene/1-octene random copolymer has a volume resistivity from greater than 1.0E+12 to less than 4.0E+15 ohm·cm.

2. The curable composition of claim 1, wherein the ethylene/1-octene random copolymer has a melt index from 10 g/10 min to 18 g/10 min.

3. An encapsulant film comprising a crosslinked polymeric composition which is the reaction product of the curable composition of claim 1.

4. The encapsulant film of claim 3, wherein the encapsulant film has a volume resistivity from greater than 9.0E+15 ohm·cm to 9.0E+16 ohm·cm.

5. The encapsulant film of claim 3, wherein the encapsulant film has a maximum torque (MH) greater than or equal to 2.0 dNm.

6. The encapsulant film of claim 3, wherein the encapsulant film has a t90 less than 11 minutes.

7. The encapsulant film of claim 3, wherein the encapsulant film has an initial glass adhesion of greater than 140 N/cm.

8. The encapsulant film of claim 3, wherein the encapsulant film has a mean transmittance greater than or equal to 88%.

9. A PV module comprising a solar cell and the encapsulant film of claim 3.

* * * * *